United States Patent [19]
Nowak et al.

[11] Patent Number: 6,043,706
[45] Date of Patent: Mar. 28, 2000

[54] METHODS AND APPARATUS FOR CONTROLLING POWER AMPLIFIER QUIESCENT CURRENT IN A WIRELESS COMMUNICATION DEVICE

[75] Inventors: Michael E. Nowak, Cary; Thomas J. Karpus, Apex; Teresa A. Muhlbauer, Cary, all of N.C.

[73] Assignee: Ericsson Inc., Morgan Hill, Calif.

[21] Appl. No.: 09/244,747

[22] Filed: Feb. 5, 1999

[51] Int. Cl.[7] ............................. G01R 19/00; H03G 3/00; H03C 1/62
[52] U.S. Cl. ................. 330/2; 330/127; 455/115
[58] Field of Search ................ 330/2, 127, 297; 455/115

[56] References Cited

U.S. PATENT DOCUMENTS

| | | | |
|---|---|---|---|
| 5,059,921 | 10/1991 | Vyne et al. | 330/297 |
| 5,311,143 | 5/1994 | Soliday | 330/127 |
| 5,483,682 | 1/1996 | Norimatsu | 455/115 |
| 5,652,547 | 7/1997 | Mokhtar et al. | 330/279 |

Primary Examiner—Robert Pascal
Assistant Examiner—Patricia T. Nguyen
Attorney, Agent, or Firm—Lyon & Lyon LLP

[57] ABSTRACT

A method is provided for controlling the quiescent current of a power amplifier in a wireless communication device, the amplifier configured to amplify an applied communication signal and employing biasing controlled by a reference voltage. In a preferred embodiment, the method includes: measuring the operating current of the communication device with no communication signal applied to the amplifier and with the reference voltage set to zero, increasing the reference voltage, while continuing to measure the operating current, until the difference between the operating current at a particular reference voltage and the operating current with the reference voltage set to zero reaches a pre-selected current value, and storing a digital value corresponding to the particular reference voltage. The pre-selected current value is preferably determined by characterizing a sufficient sample of amplifiers (e.g., based on model or production lot) to determine a minimum amplifier quiescent current adequate to meet desired performance characteristics for a particular system or application.

13 Claims, 1 Drawing Sheet

METHODS AND APPARATUS FOR CONTROLLING POWER AMPLIFIER QUIESCENT CURRENT IN A WIRELESS COMMUNICATION DEVICE

BACKGROUND OF THE INVENTION

1. Field of the Invention

The present invention pertains generally to the field of wireless communication devices and, more particularly, to methods and apparatus for controlling power amplifier quiescent current in wireless communication devices.

2. Background

Driven mainly by consumer markets, there is an ongoing demand for increased battery talk and standby time in wireless communication devices—i.e., between battery recharging periods. As such, the power consumption of every circuit in the communication devices is preferably designed to perform its function while consuming the minimum amount of battery power. Optimal performance is further advantageous in that it reduces the amount of heat generated by the communication device.

The use of radio frequency (RF) power transistors as amplifiers in wireless communication devices is well known. With the considerable recent growth in the demand for wireless services, such as personal communication services (PCS), the operating frequency of wireless networks has increased dramatically and is now well into the gigahertz (GHz) range. Achieving consistent performance characteristics in mass-produced amplifier transistor devices, however, is difficult.

FIG. 1 illustrates a typical power amplifier configuration employed in a wireless transmitter 10. An RF input signal to be transmitted, $RF_{IN}$, is passed through a transmission band pass filter 14 and then input into a power amplifier 16. The power amplifier 16 also receives an input supply voltage $V_S$ 18 and a reference voltage $V_{REF}$ 20. In particular, the reference voltage $V_{REF}$ 20 controls a biasing circuit (not shown) of the power amplifier 16, which, in turn, controls the amplifier DC operating point. Once amplified, the input signal $RF_{IN}$ is passed through an output impedance matching network 22 and duplexer 24 for transmission via an antenna 26.

The overall efficiency, $\eta$, of a transmitter to produce the required RF output power in relation to the DC input (i.e., battery) power is:

$$\eta = (P_{OUT\_RF}/P_{IN\_DC})*100\%,$$

where $P_{OUT\_RF}$ is the RF power output of the transmitter and $P_{IN\_DC}$ is the DC input power.

The DC input power is calculated as:

$$P_{IN\_DC} = V_{IN\_DC} * I_{IN\_DC},$$

where: $V_{IN\_DC}$ is the voltage and $I_{IN\_DC}$ is the current, respectively, of the input voltage supply. Notably, the input voltage : $V_{IN\_DC}$ may be directly from a battery source, or may be stepped up or down via a controller circuit.

Thus, the transmitter efficiency can be defined as:

$$\eta = (P_{OUT\_RF}/(V_{IN\_DC} * I_{IN\_DC}))*100\%.$$

For communication devices that are designed to operate in digital wireless systems in which the transmitter output power extends over a relatively large dynamic range, it is of critical importance to incorporate a design that has the highest efficiency over the wide output power range. Power amplifiers used in the linear modulation transmitter schemes for these systems must further exhibit linear performance to meet Adjacent Channel Power (ACP) requirements. In particular, high power amplifier linearity results in better ACP performance, —i.e., low spectral re-growth. Conversely, as the power amplifier linearity decreases, the spectral re-growth increases, resulting in poorer ACP performance.

At the upper output power range of a power amplifier, higher DC input power is generally required for higher linearity at a specific output power. However, higher linearity is generally at the expense of lower efficiency. In practice, it is a difficult challenge to meet ACP and other performance requirements, while minimizing the DC input power to the power amplifier.

In general, the operating parameters of a power amplifier are set in part by the quiescent point and load impedance of each individual amplification stage. The quiescent point is defined by the operating voltage and quiescent current for the particular stage. The quiescent current, $I_{IN\_DC}q$, also referred to as "idle current", is the DC input current drawn by the power amplifier in the absence of an RF input signal. In other words, with no RF input signal, the DC input current $I_{IN\_DC}$ to the power amplifier equals the sum of the quiescent currents of the individual stages. For higher output power, the quiescent current comprises a smaller portion of the DC input current, and for lower output power, a much greater proportion.

It is desirable to minimize the power amplifier quiescent current in order to achieve overall higher transmitter efficiency. Minimizing quiescent current has the most impact on DC input current, and thus battery talk and standby time, when the power amplifier is operated at relatively low output power. In particular, as the amplifier output power is decreased, the DC input current asymptotically approaches the quiescent current. The DC input current essentially equals the quiescent current at a specific RF output power, $P_{OUT\_RF}a$, where the designation "a" indicates the power amplifier is operating in class A operation for $P_{OUT\_RF\_} \leq P_{OUT\_RF}a$. For $P_{OUT\_RF\_} \leq P_{OUT\_RF}a$, $P_{IN\_DC} = I_{IN\_DC}q * V_S$.

In digital wireless systems where the average power amplifier output power during a call is substantially less than the maximum rated output power of the communication device, it is desirable to minimize the amplifier quiescent current $I_{IN\_DC}q$, since it is a major factor in determining battery talk and standby time.

Due to the natural variables of each amplifier in a large scale production of power amplifiers, the respective amplifier quiescent currents will exhibit a broad distribution of values with respect to a fixed biasing control reference voltage. As such, the reference voltage value must be set to a sufficiently high value such that the lowest quiescent current values in the distribution range are still adequate for meeting the minimum power amplifier performance requirements. Of course, the resultant mean battery talk time of communication devices will be lower than would be possible if the quiescent current was optimized on an amplifier by amplifier basis.

Toward this end, U.S. Pat. No. 5,311,143 ("the '143 patent") assigned to Motorola discloses a method for adjusting the power amplifier quiescent current as a function of the total current draw and/or detected RF in/out power. According to this approach, the amplifier quiescent current is adjusted dynamically under presence of an RF input signal, which is somewhat complex and relatively expensive to employ in a very cost sensitive product, as are wireless handsets.

Thus, it would be desirable to provide a relatively simple, economic and reliable means for controlling the power amplifier quiescent current in wireless transmitters.

SUMMARY OF THE INVENTION

In accordance with a first aspect of the invention, a method is provided for controlling the quiescent current of a power amplifier in a wireless communication device, independent of other power amplifier operating parameters.

In a preferred embodiment, wherein the amplifier configured to amplify an applied communication signal and employing biasing controlled by a reference voltage, a method for controlling the amplifier quiescent current includes:

measuring the operating current of the communication device with no communication signal applied to the amplifier and with the reference voltage set to zero, increasing the reference voltage, while continuing to measure the operating current, until the difference between the operating current at a particular reference voltage and the operating current with the reference voltage set to zero reaches a pre-selected quiescent current value, and storing a digital value corresponding to the particular reference voltage at which the pre-selected quiescent current is reached.

In accordance with another aspect of the invention, a microprocessor is employed to store the digital value corresponding to the "calibrated" reference voltage and to thereafter regenerate the reference voltage for controlling the amplifier operation. In a preferred embodiment, the reference voltage is generated by the microprocessor by outputting a digital signal that is converted into an analog reference voltage by a digital-to-analog circuit, such as, e.g., a low pass filter.

In accordance with a further aspect of the invention, the pre-selected current value is determined by characterizing a sufficient sample of amplifiers (e.g., based on amplifier model, or production lot) to determine a minimum amplifier quiescent current adequate to meet desired performance characteristics for a particular system or application.

Because the relationship between the biasing control reference voltage and amplifier quiescent current varies naturally between individual amplifiers, each transmitter will have its own unique control reference voltage, allowing for increased mean transmitter operating efficiency.

As will be apparent to those skilled in the art, other and further aspects and advantages of the present invention will appear hereinafter.

BRIEF DESCRIPTION OF THE DRAWINGS

The present invention is illustrated by way of example, and not by way of limitation, in the figures of the accompanying drawings, in which.

DETAILED DESCRIPTION OF THE PREFERRED EMBODIMENTS

Figure 1:
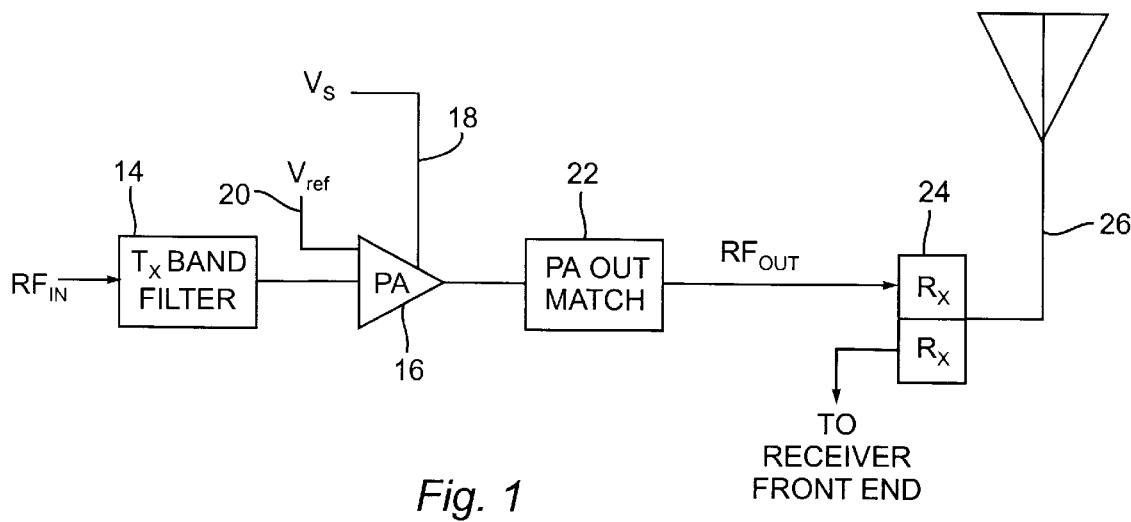
FIG. 1 is a simplified functional diagram of an exemplary power amplification configuration in a wireless transmitter.
Figure 2:
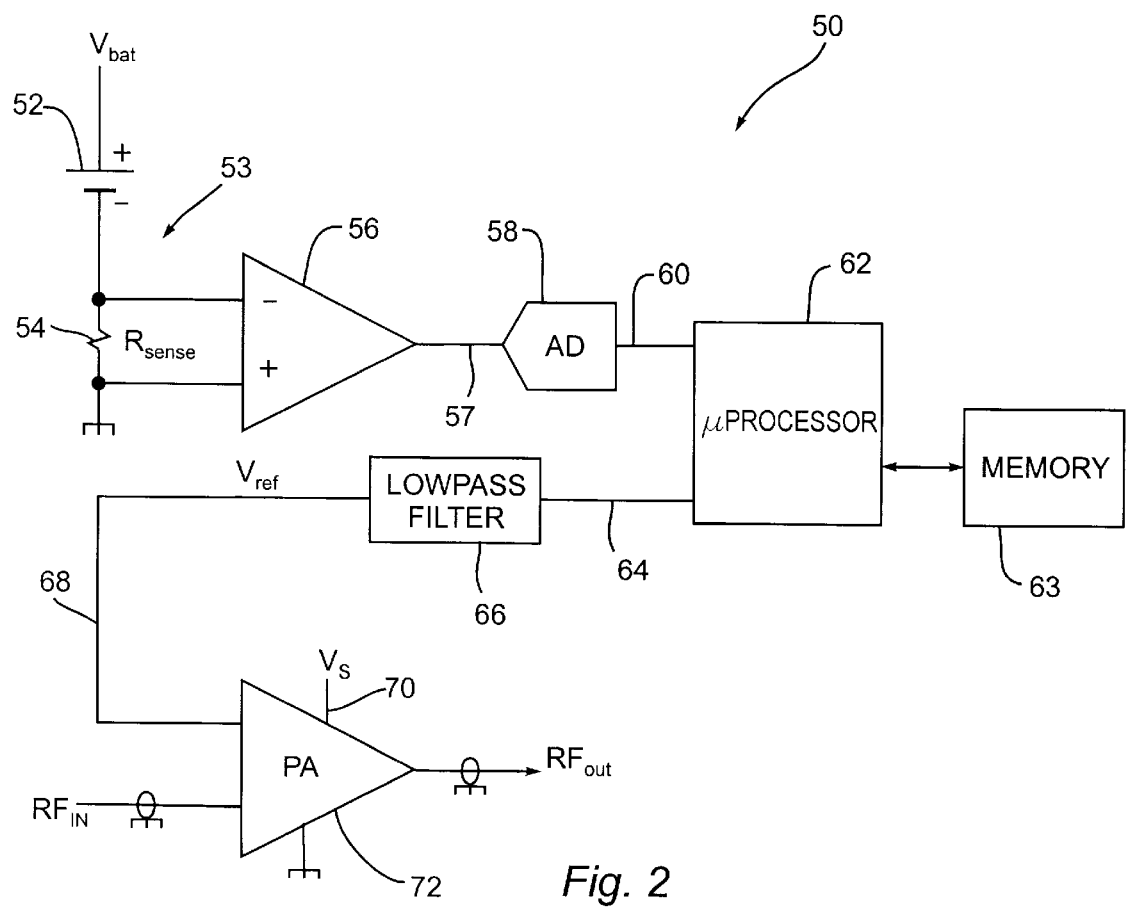
FIG. 2 is schematic illustration of a preferred quiescent current control circuit constructed in accordance with the present invention.

Referring to FIG. 2, a preferred wireless communication device 50 includes a power source 52, e.g., DC battery 52. A current sensing circuit 53 includes a low value sensing resistor 54 in series with the DC battery 52 and a differential amplifier 56 having respective positive and negative terminals across the sensing resistor 54. In this manner, the differential amplifier 56 outputs a signal 57 representing the current being drawn on the power source 52 due to all operations of the communication device 50.

The sensed current signal 57 is input into an analog-to-digital (A/D) converter 58, which converts the signal 57 into digital data 60 representative of the analog current value. The digital data 60 is input into a microprocessor 62, which operates in conjunction with an associated memory 63. As explained in greater detail below, the microprocessor 62 outputs a digital signal 64, e.g., an asynchronous pulse train, which is converted into an analog voltage via a low pass filter 66 to generate a reference voltage 68 used for controlling a power amplifier 72.

In particular, the power amplifier 72 is configured to amplify an RF input signal $RF_{IN}$ as part of the operation of the communication device 50. The amplifier 72 also receives as inputs a supply voltage 70 and the reference voltage 68. In preferred embodiments, the supply voltage 70 may be supplied directly from the power source 52, or it may be converted (i.e., stepped up or down) with a power supply controller (not shown). The power amplifier 72 includes internal biasing circuitry (not shown), which controls the amplifier's DC operating condition. The biasing circuitry, in turn, is controlled by the reference voltage 68 supplied by the microprocessor 62.

In accordance with a first aspect of the invention, the reference voltage 68 is calibrated to optimizing the operating quiescent current $I_{IN\_DC}q$ of the power amplifier 72. In a presently preferred embodiment, the reference voltage calibration process is performed by the microprocessor 62, although, as will be apparent to those skilled in the art, the calibration process could be performed manually.

In particular, the microprocessor 62 first measures (i.e., reads) the non-amplifier portion of the operating current (i.e., digital data signal 60) with the power amplifier 72 OFF—i.e., with no RF input signal applied to the amplifier and with the reference voltage 68 set to zero by the microprocessor 62.

The microprocessor 62 then increases the reference voltage 68 via the digital pulse train signal 64, while continuing to monitor the operating current signal 60, until the difference between the measured operating current and the non-amplifier portion of the operating current reaches a pre-selected, optimal quiescent current. In other words, the microprocessor 62 increases the biasing control reference voltage 68, until a pre-selected amplifier quiescent current is reached, taking into account the measured non-amplifier current portion, which is subtracted from the total measured value.

Once the desired amplifier quiescent current level is reached, the corresponding reference voltage 68 is stored by the microprocessor in the memory 63 as the "calibrated" reference voltage for optimal operation of the amplifier 72. In accordance with a further aspect of the invention, the biasing control reference voltage 68 is thereafter maintained by the microprocessor 62 at this calibrated level, so as to optimize amplifier efficiency.

By individually calibrating the respective biasing reference voltages of respective wireless communication devices based on the particular quiescent current consumption of each individual amplifier, overall power efficiency in the communication device 50 is improved over the prior art approach of using a pre-selected uniform reference voltage.

While preferred embodiments and applications of the present invention have been shown and described, as would be apparent to those skilled in the art, many modifications and applications are possible without departing from the inventive concepts herein.

Thus, the scope of the disclosed invention is not to be restricted except in accordance with the appended claims.

What is claimed is:

1. A method for controlling the DC input power of an amplifier in a wireless communication device, the amplifier configured to amplify an applied communication signal and employing biasing controlled by a reference voltage, the method comprising:

measuring the operating current of the communication device with no communication signal applied to the amplifier and with the reference voltage set to zero;

increasing the reference voltage, while continuing to measure the operating current, until the difference between the operating current at a particular reference voltage and the operating current with the reference voltage set to zero reaches a pre-selected current value; and storing a digital value corresponding to the particular reference voltage.

2. The method of claim 1, further comprising:

generating the reference voltage from the stored digital value.

3. The method of claim 1, wherein the pre-selected current value is determined by characterizing a sample number of amplifiers to determine a minimum amplifier quiescent current value adequate to meet desired performance characteristics.

4. The method of claim 1, wherein the digital value is stored in a memory associated with a microprocessor.

5. The method of claim 4, wherein the microprocessor outputs a digital signal corresponding to the stored digital value, and further comprising converting the digital signal into the reference voltage.

6. The method of claim 5, wherein the digital signal is converted into the reference voltage by a low-pass filter.

7. The method of claim 1, wherein the operating current is measured by a current sensing circuit in series with a DC power source for the communication device.

8. The method of claim 7, wherein the current sensing circuit includes a differential amplifier having inputs across a sensing resistor in series with the DC power source, the differential amplifier outputting a sensed current signal.

9. The method of claim 8, further comprising;

converting the sensed current signal into a digital data stream.

10. A method for controlling the amplifier quiescent current in a wireless communication device, the amplifier configured to amplify an applied communication signal and employing biasing controlled by a reference voltage, the communication wireless device including a DC power source and a microprocessor, the method comprising:

measuring the operating current of the communication device with no communication signal applied to the amplifier and with the reference voltage set to zero;

increasing the reference voltage, while continuing to measure the operating current, until the difference between the operating current at a particular reference voltage and the operating current with the reference voltage set to zero reaches a pre-selected current value;

storing a digital value corresponding to the particular reference voltage in a memory associated with the microprocessor; and generating the reference voltage from the stored digital value.

11. The method of claim 10, wherein the pre-selected current value is determined by characterizing a sample number of amplifiers to determine a minimum amplifier quiescent current value adequate to meet desired performance characteristics.

12. The method of claim 10, wherein the reference voltage is generated by the microprocessor outputting a signal corresponding to the stored digital value.

13. The method of claim 10, wherein the operating current is measured by a current sensing circuit in series with the DC power source.

* * * * *